United States Patent
Kim et al.

(10) Patent No.: US 7,613,982 B2
(45) Date of Patent: Nov. 3, 2009

(54) DATA PROCESSING APPARATUS AND METHOD FOR FLASH MEMORY

(75) Inventors: Jin-kyu Kim, Seoul (KR); Min-young Kim, Suwon-si (KR); Jang-hwan Kim, Seoul (KR); Song-ho Yoon, Bucheon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 400 days.

(21) Appl. No.: 11/274,115

(22) Filed: Nov. 16, 2005

(65) Prior Publication Data

US 2006/0120166 A1 Jun. 8, 2006

(30) Foreign Application Priority Data

Nov. 16, 2004 (KR) ............... 10-2004-0093607

(51) Int. Cl.
*G11C 29/00* (2006.01)
(52) U.S. Cl. ............... 714/766; 714/722; 714/746; 714/753; 714/768; 714/773
(58) Field of Classification Search ............... 714/766, 714/722, 746, 753, 758, 768, 773
See application file for complete search history.

(56) References Cited

U.S. PATENT DOCUMENTS

| 3,840,862 | A | * | 10/1974 | Ready ............... 711/128 |
| 4,617,660 | A | * | 10/1986 | Sakamoto ............... 714/6 |
| 4,980,888 | A | * | 12/1990 | Bruce et al. ............... 714/718 |
| 5,617,348 | A |   | 4/1997 | Maguire |
| 5,630,093 | A |   | 5/1997 | Holzhammer et al. |
| 5,708,790 | A | * | 1/1998 | White et al. ............... 711/203 |
| 5,875,477 | A |   | 2/1999 | Hasburn et al. |
| 5,925,141 | A |   | 7/1999 | Ariki |
| 6,000,006 | A |   | 12/1999 | Bruce et al. |
| 6,014,755 | A |   | 1/2000 | Wells et al. |
| 6,141,251 | A | * | 10/2000 | Xing ............... 365/185.11 |

(Continued)

FOREIGN PATENT DOCUMENTS

CN 1480953 A 3/2004

(Continued)

OTHER PUBLICATIONS

IBM Technical Disclosure Bulletin, "Memory Error Detection Using Error Correction Code Hardware", Jan. 1986, vol. 28, Issue 8, pp. 1698-1699.*

(Continued)

*Primary Examiner*—Matt Kim
*Assistant Examiner*—Christopher D Birkhimer
(74) *Attorney, Agent, or Firm*—Sughrue Mion, PLLC

(57) ABSTRACT

A data processing apparatus and method for a flash memory, which make it easy to determine whether data stored in the flash memory is valid, are provided. The data processing apparatus includes a user request unit which issues a request for performing a data operation on a flash memory using a predetermined logical address, a conversion unit which converts the logical address into a physical address, and a control unit which performs the data operation on the physical address and writes inverted data obtained by inverting error correction code (ECC) corresponding to data used in the data operation to a region indicating whether the ECC is erroneous.

20 Claims, 9 Drawing Sheets

U.S. PATENT DOCUMENTS

| | | | |
|---|---|---|---|
| 6,158,004 A * | 12/2000 | Mason et al. | 713/150 |
| 6,275,960 B1 | 8/2001 | Cappelletti et al. | |
| 6,374,324 B2 | 4/2002 | Han | |
| 6,910,169 B2 | 6/2005 | Sharma | |
| 2002/0184592 A1 | 12/2002 | Koga et al. | |
| 2003/0099134 A1 | 5/2003 | Lasser et al. | |
| 2005/0013154 A1 | 1/2005 | Honda et al. | |

FOREIGN PATENT DOCUMENTS

| | | |
|---|---|---|
| EP | 1100205 | 5/2001 |
| JP | 63-298602 | 12/1988 |
| JP | 6-67912 A | 3/1994 |
| JP | 6-309185 A | 11/1994 |
| JP | 7-182886 | 7/1995 |
| JP | 10-134586 | 5/1998 |
| JP | 11-16389 A | 1/1999 |
| JP | 2000-067588 | 3/2000 |
| JP | 2000-99405 | 4/2000 |
| JP | 2001-92723 A | 4/2001 |
| JP | 2001-351398 A | 12/2001 |
| JP | 2003-187585 | 7/2003 |
| KR | 10-200-0011610 | 2/2000 |
| KR | 10-2004-0042478 | 5/2004 |
| KR | 10-2005-0040120 | 5/2005 |
| WO | 2004/031966 | 4/2004 |

OTHER PUBLICATIONS

IBM Technical Disclosure Bulletin, "Inverted ECC To Flag Unreliable Data", Aug. 1982, vol. 25, Issue 3B, pp. 16-13-1614.*
Rene Martinez, "ECC", Jul. 2001, pp. 1-5, http://searchnetworking.techtarget.com/sDefinition/0,,sid7_gci212028,00.html.*
Microsoft, "Computer Dictionary", 2002, Fifth Edition, p. 76.*
Kamali. "Error Control Coding: Protecting Digital Information Through the Bumpy Course of Transmission and Storage." IEEE Potentials: New York, Apr. 1995, vol. 14, No. 2, pp. 15-19.

* cited by examiner

DATA PROCESSING APPARATUS AND METHOD FOR FLASH MEMORY

CROSS-REFERENCE TO RELATED APPLICATION

This application claims priority from Korean Patent Application No. 10-2004-0093607 filed on Nov. 16, 2004 in the Korean Intellectual Property Office, the disclosure of which is incorporated herein by reference in its entirety.

BACKGROUND OF THE INVENTION

1. Field of the Invention

Apparatuses and methods consistent with the present invention relate to data processing for a flash memory, and more particularly, to data processing for a flash memory which makes it easy to determine whether data stored in the flash memory is valid.

2. Description of the Related Art

In general, home appliances, communications devices, and embedded systems, such as set-top boxes, use non-volatile memories as storage devices for storing and processing data.

Flash memories are a type of non-volatile memory, in which data can be electrically erased and overwritten. Flash memories are suitable for portable devices because they consume less power than magnetic disc memory-based storage mediums, are as accessible as hard discs, and are compact-sized.

In the flash memory, when new data is overwritten on pre-written data, a process of erasing the whole block, in which the pre-written data is stored, is required due to a hardware characteristic of the flash memory.

In order to prevent performance deterioration of the flash memory, which may occur due to discordance between a data writing unit and a data erasure unit in the flash memory, concepts of a logical address and a physical address are introduced.

Herein, the logical address is an address used when a user requests a data operation, such as data reading, data writing, etc., in the flash memory through a predetermined user program, and the physical address is an address used when the flash memory actually performs the data operation, such as data reading, data writing, etc.

In addition, a flash memory is classified into a small-block flash memory or a large-block flash memory. In a small-block flash memory, a logical operation unit is identical to a physical operation unit, while in a large-block flash memory, a physical operation unit is larger than a logical operation unit.

FIG. 1A is a diagram illustrating the structure of a typical small-block flash memory, and FIG. 1B is a diagram illustrating the structure of a typical large-block flash memory.

Referring to FIG. 1A, a sector 11 which is a logical operation unit of a small-block flash memory constitutes a page 12 which is a physical operation unit of the small-block flash memory.

In other words, the logical operation unit of the small-block flash memory is the same as the physical operation unit of the small-block flash memory. On the other hand, referring to FIG. 1B, at least one sector 21 which is a logical operation unit of a large-block flash memory constitutes a page 22 which is a physical operation unit of the large-block flash memory.

A flash memory-based system may unexpectedly suffer from frequent power interruptions due to its characteristics. Therefore, the flash memory-based system needs a function of recovering data damaged or lost due to a power interruption.

In detail, the operations of writing data to and reading data from a flash memory will now be described in detail. If power is cut off in the process of writing data to a flash memory, only part of the data is successfully written to the flash memory. Meanwhile, if power is cut off in the process of erasing data from a flash memory, only part of the data is successfully erased from the flash memory.

Therefore, a variety of methods of determining whether data stored in a flash memory is valid if power is cut off before completing the process of performing a data operation, such as a write operation or an erase operation, on the flash memory have been suggested.

Conventionally, error correction code (ECC) has been widely used to determine whether data stored in a flash memory is valid when an unexpected event, such as a power outage or write disturbance, occurs. ECC may detect and correct errors therein as well as errors in other data.

In detail, referring to FIG. 2, a flash memory comprises a block 34, and the block 34 comprises a plurality of pages 33 each consisting of a data region 31 and an ECC region 32.

One-bit errors are likely to occur in a flash memory. ECC can detect and correct one-bit errors and detect, but not correct, two-bit to (m−1)-bit errors. It is yet to be known whether ECC can be adapted to detect and correct errors of m bits or more. In other words, ECC may not be able to detect or correct errors of m bits or more properly. Therefore, ECC is written to a flash memory when performing a data operation on the flash memory, and thus, when error occurs in the flash memory due to an unexpected event, such as a power outage, the error can be detected and/or corrected using the ECC.

FIG. 3 is a flowchart illustrating a conventional method of detecting and correcting errors using ECC.

Referring to FIG. 3, in operation S10, data and ECC are extracted from a flash memory.

In operation S20, ECC is generated based on the extracted data obtained in operation S10. The generated ECC is based on the same algorithm as the extracted ECC.

In operation S30, it is determined whether the generated ECC matches the extracted ECC. If it is determined in operation S20 that the generated ECC does not match the extracted ECC, error detection is performed on the extracted data and the extracted ECC.

It is assumed that ECC can detect and correct one-bit errors and can detect but not correct two-bit errors and that it is not certain whether ECC is able to detect and correct errors of three or more bits, and thus there is a possibility of ECC correcting errors of three or more bits improperly.

If a one-bit error is detected from the extracted data and the extracted ECC in operation S40, error correction is carried out on the one-bit error in operation S50. Thereafter, in operation S60, the extracted data is determined as being valid.

In operation S70, if a two-bit error is detected from the extracted data and the extracted ECC, an error occurrence message is created. Since ECC cannot correct but can detect a two-bit error, the extracted data is determined as being invalid in operation S80.

If it is determined in operation S30 that the generated ECC matches the extracted ECC, the extracted data is determined as being valid in operation S60.

At this time, if a three-bit error is detected from the extracted data and the extracted ECC, for example, if a one-bit error is detected from the extracted data and a two-bit error is detected from the extracted ECC, the three-bit error may be improperly corrected, in which case, however, the extracted data is mistakenly determined as being valid even though it is not.

In detail, if 3 erroneous bits are detected from a flash memory, one from a data region 31 of a flash memory where data exists and the other two from an ECC region 32 of the flash memory, as illustrated in FIG. 4A, ECC may mistakenly correct a bit other than the erroneous bit detected from the data region 31, as illustrated in FIG. 4B. Therefore, there has been a need to minimize the possibility of improper error correction when three or more erroneous bits are simultaneously detected from a flash memory.

Japanese Patent Laid-Open Publication No. 1999-016389 discloses a semiconductor memory device which stores a data signal, a parity signal, and an inverted parity signal together. However, the semiconductor memory device is not able to correct greater than three erroneous bits of a flash memory.

Accordingly, there still exists a need for ECC processing of three or more erroneous bits.

SUMMARY OF THE INVENTION

The present invention provides a data processing apparatus and method for a flash memory by which it can be easily determined whether data stored in a flash memory is valid when a predetermined data operation performed on the flash memory is unexpectedly interrupted.

According to an aspect of the present invention, there is provided a data processing apparatus for a flash memory including a user request unit which issues a request for performing a data operation on a flash memory using a predetermined logical address, a conversion unit which converts the logical address into a physical address, and a control unit which performs the data operation on the physical address and writes inverted data obtained by inverting a generated ECC corresponding to data loaded in a buffer to be used in the data operation to a region for indicating whether an extracted ECC is erroneous.

According to another aspect of the present invention, there is provided a data processing apparatus for a flash memory including an extraction unit which extracts from memory regions ECC and inverted data obtained by inverting ECC generated from data loaded into a buffer to be used in the data operation, the data being loaded into the buffer prior to being written into a memory region. The extracted ECC and the extracted inverted data corresponding to data located at a predetermined logical address, and a control unit which determines whether the extracted ECC is erroneous and how many erroneous bits the extracted ECC includes with reference to the relationship between the extracted ECC and the extracted inverted data.

According to still another aspect of the present invention, there is provided a data processing method for a flash memory including issuing a request for performing a data operation on a flash memory using a predetermined logical address, converting the logical address into a physical address, and performing the data operation on the physical address and writing inverted data obtained by inverting a generated ECC corresponding to data loaded in a buffer to be used in the data operation to a region for indicating whether an extracted ECC is erroneous.

According to a further aspect of the present invention, there is provided a data processing method for a flash memory including extracting ECC and inverted data obtained by inverting ECC generated from data used in the data operation loaded into a buffer before being written into the flash memory, the extracted ECC and the extracted inverted data corresponding to data located at a predetermined logical address, and determining whether the extracted ECC is erroneous and how many erroneous bits the extracted ECC includes with reference to the relationship between the extracted ECC and the extracted inverted data.

BRIEF DESCRIPTION OF THE DRAWINGS

The above and other aspects of the present invention will become more apparent by describing in detail exemplary embodiments thereof with reference to the attached drawings in which.

DETAILED DESCRIPTION OF EXEMPLARY THE INVENTION

Figure 1A:
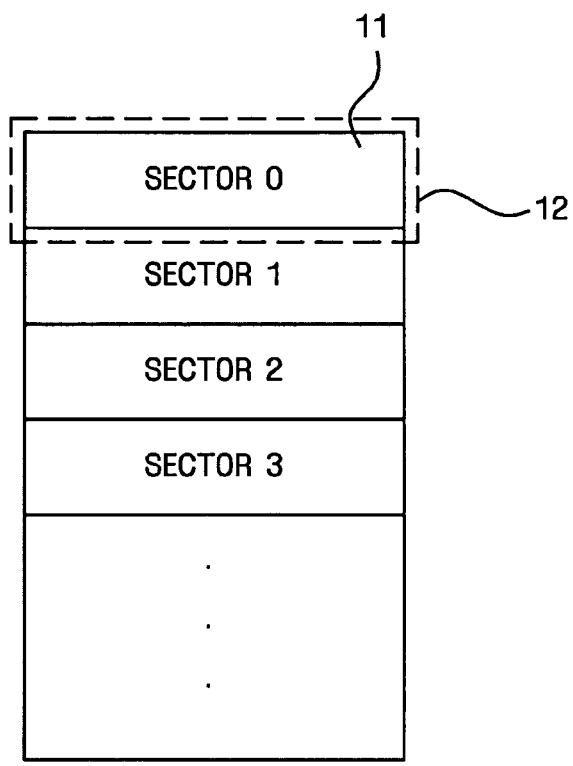
FIG. 1A is a diagram illustrating the structure of a typical small-block flash memory.
Figure 1B:
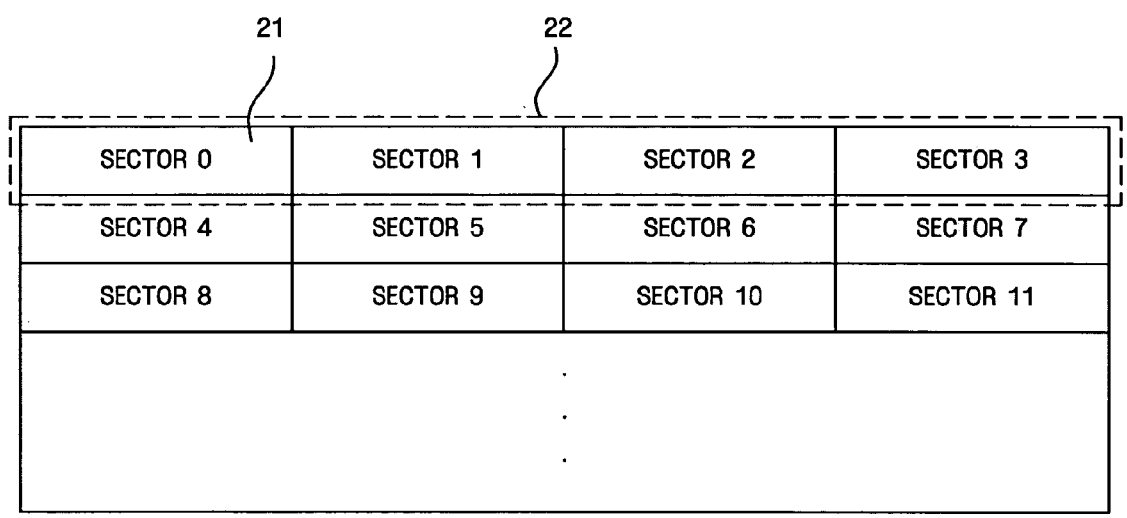
FIG. 1B is a diagram illustrating the structure of a typical large-block flash memory.
Figure 2:
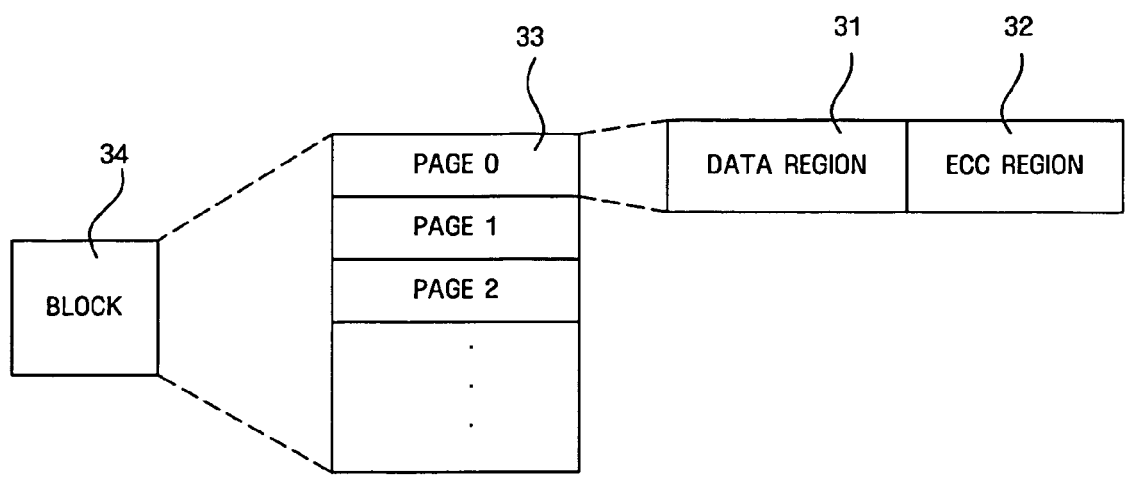
FIG. 2 is a diagram illustrating the structure of a conventional flash memory comprising a data region and an ECC region.
Figure 3:
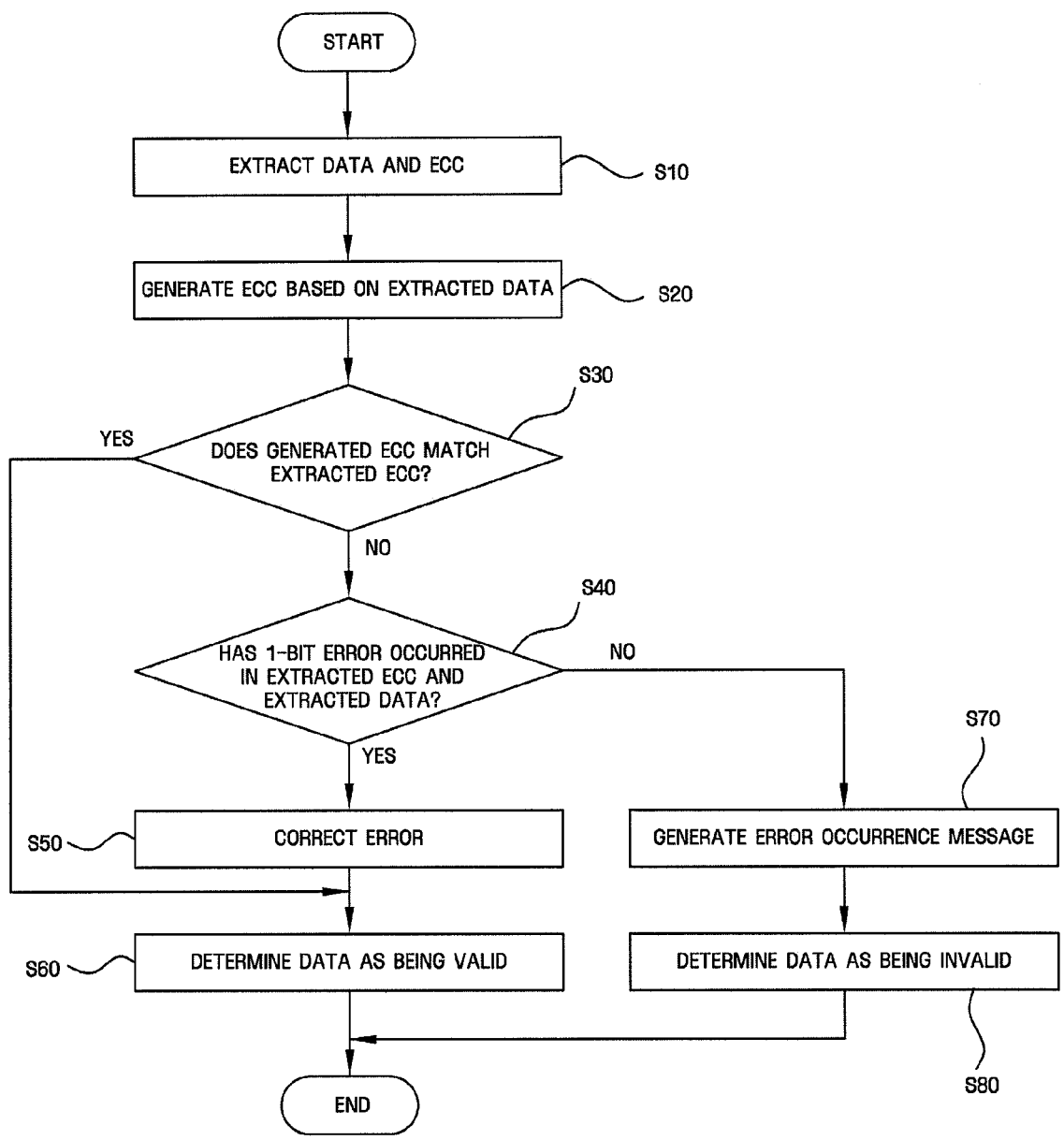
FIG. 3 is a flowchart illustrating a conventional method of detecting and correcting errors occurring in a flash memory using ECC.
Figure 4A:
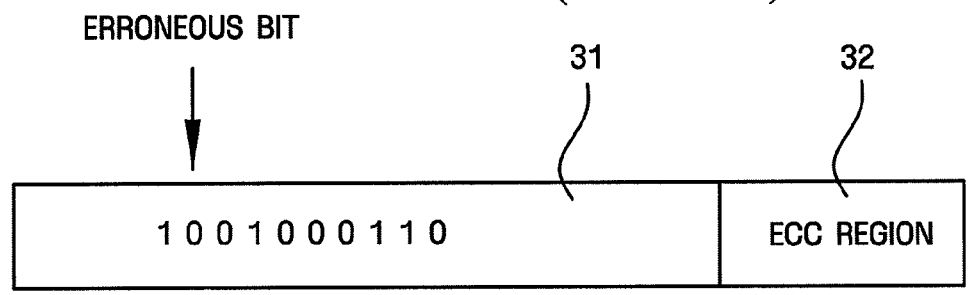
FIG. 4A is a diagram illustrating an error occurring in a data region of a conventional flash memory.
Figure 4B:
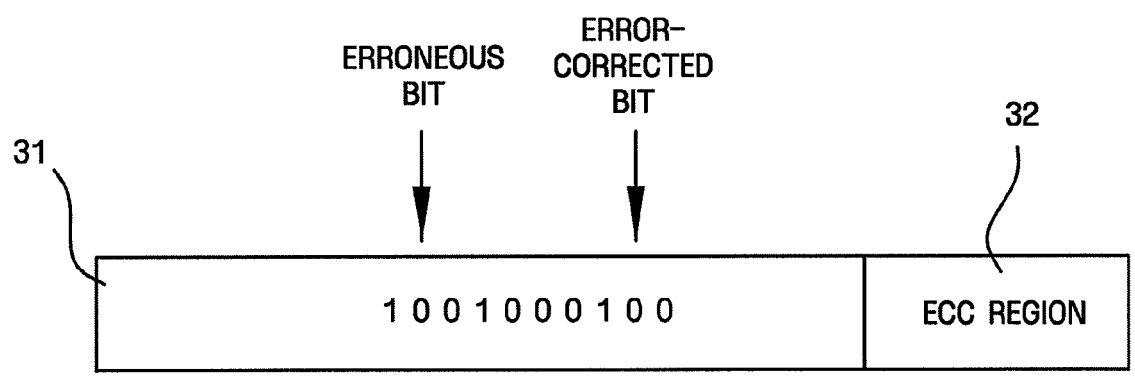
FIG. 4B is a diagram illustrating an example of improper error correction performed on a conventional flash memory.

The present invention will now be described more fully with reference to the accompanying drawings, in which exemplary embodiments of this invention are shown. Advantages and features of the present invention and methods of accomplishing the same may be understood more readily by reference to the following detailed description of exemplary embodiments and the accompanying drawings. The present invention may, however, be embodied in many different forms and should not be construed as being limited to the exemplary embodiments set forth herein. Rather, these exemplary embodiments are provided so that this disclosure will be thorough and complete and will fully convey the concept of the invention to those skilled in the art, and the present invention will only be defined by the appended claims. Like reference numerals refer to like elements throughout the specification.

In general, flash memories are classified into small-block flash memories and large-block flash memories.

The small-block flash memory has a characteristic that the size of a page, which is an actually physical data operation unit, is identical to that of a sector, which is a logical data operation unit. In contrast, the large-block flash memory has a characteristic that the size of a page, which is an actually physical data operation unit, is larger than that of a sector, which is a logical data operation unit.

Herein, the sector is a logical data operation unit used when a user performs data operations, such as a data reading operation, a data writing operation, etc., in the flash memory by means of a predetermined user program.

The page, which is a physical data operation unit used when a data operation is actually performed in the flash memory, includes an operation unit for reading data from the flash memory and an operation unit for writing data into the flash memory.

The physical data operation unit is not limited to the page, but may be defined in various sizes, for example, a block, according to used devices.

ECC is written to a flash memory for use in a case where an unexpected event, such as a power outage, occurs during the performing of a data operation on each sector of the flash memory. ECC can detect not only errors therein but also errors in other data.

In general, ECC can detect and correct one-bit errors and detect, but not correct, two-bit to (m−1)-bit errors. It is yet to be known whether ECC can be adapted to detect and correct errors of m bits or more where m is determined according to what type of algorithm the ECC is based on and how the algorithm is embodied. In the present exemplary embodiment, it is assumed that m=3. Accordingly, in the present exemplary embodiment, it is assumed that ECC can detect and correct one-bit errors and detect, but not correct two-bit errors and that it is yet to be known whether the ECC can be adapted to detect and correct errors of three or more bits.

If errors of three or more bits occur in data and ECC of a flash memory, they may not be detected at all or may be detected, but improperly corrected. Therefore, in the present exemplary embodiment, a data processing apparatus for a flash memory which is capable of minimizing the possibility of improper error correction even when errors of three bits or more occur in a flash memory is provided.

Figure 5:
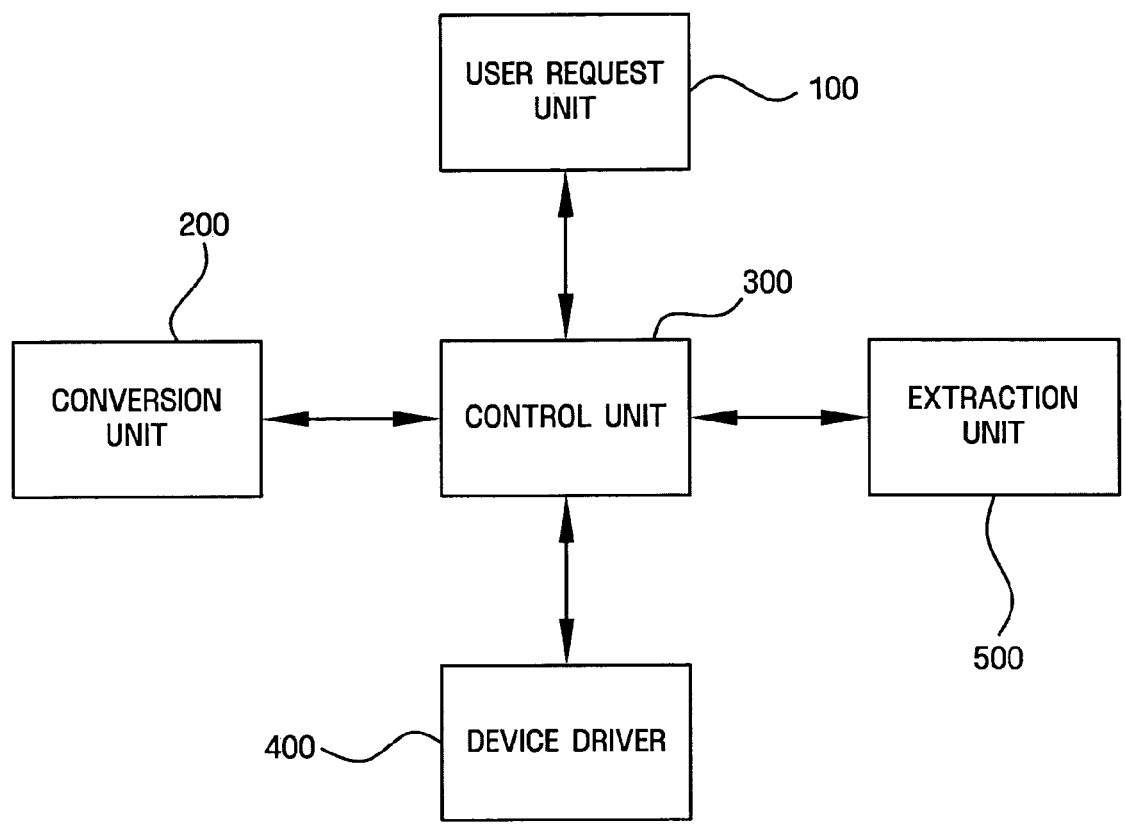
FIG. 5 is a block diagram of a data processing apparatus for a flash memory according to an exemplary embodiment of the present invention.

FIG. 5 is a block diagram of a data processing apparatus for a flash memory according to an exemplary embodiment of the present invention.

Referring to FIG. 5, the data processing apparatus includes a user request unit 100 which is used by a user to issue a request for performing a predetermined data operation on a flash memory using a predetermined logical address, a conversion unit 200 which converts the logical address into a physical address, a device driver 400 which controls the operation of the flash memory using the physical address provided by the conversion unit 200, a control unit 300 which performs the predetermined data operation on the flash memory with the aid of the device driver 400 and writes inverted data obtained by inverting ECC for predetermined data to an index region used for indicating whether the ECC is valid, and an extraction unit 500 which extracts the ECC and the inverted data to determine whether the ECC is valid.

Figure 6:
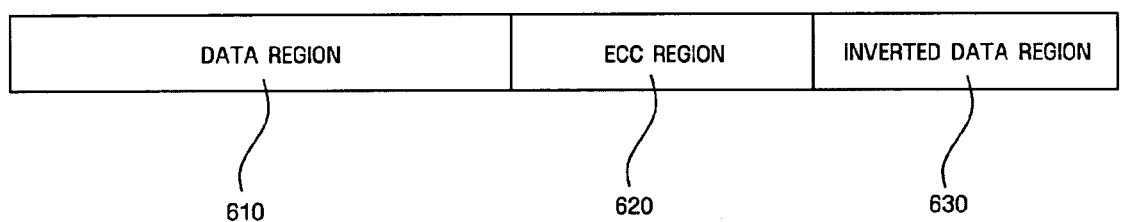
FIG. 6 is a diagram illustrating the structure of a flash memory according to an exemplary embodiment of the present invention.

FIG. 6 is a diagram illustrating the structure of a flash memory according to an exemplary embodiment of the present invention. Referring to FIG. 6, the flash memory comprises a data region 610 which has at least one logical address and in which a data operation the flash memory is subjected to is actually performed, an ECC region 620 which stores ECC corresponding to data stored in the data region 610, and an inverted data region 630 which stores inverted data obtained by inverting the ECC. The ECC may be generated using the data corresponding to the ECC by a Hamming code technique and then written to the ECC region 620 when the data corresponding to the ECC is written to the data region 610. In other words, the ECC is first generated using the data to be used in the data operation temporarily loaded into a buffer. Thereafter, the generated ECC is stored in the ECC region 620 when the data corresponding to the generated ECC is written from the buffer to the data region 610. The inverted data is also loaded in the buffer upon its generation, and thereafter, stored in inverted data region 630. In addition, in the case of determining whether the data stored in the data region 610 is valid, ECC is generated based on the data stored in the data region 610 by using the same algorithm used to generate the ECC stored in the ECC region 620, and it is determined whether an error has occurred in the data region 610 by comparing the generated ECC with the ECC stored in the ECC region 620. If an error is detected from the data region 610, it may be corrected.

Here, the inverted data is obtained by converting the generated ECC loaded in the buffer using a predetermined conversion method. The predetermined conversion method may be a 1's complement number conversion method. Alternatively, various conversion methods (e.g., a 2's complement number conversion method) other than a 1's complement number conversion method may be used to invert the ECC stored in the ECC region 620 as long as the original ECC data can be fully recovered by inverting the inversion result. For example, if the ECC loaded in the buffer is "1010", inverted data obtained by inverting the generated ECC using a 1's complement number conversion method may be "0101".

The control unit 300 may detect errors occurring in the ECC region 620 by analyzing the relationship between the ECC stored in the ECC region 620 and the inverted data stored in the inverted data region 630. The extraction unit 500 extracts the ECC and the inverted data from the ECC region 620 and the inverted data region 630, respectively, and the control unit 300 determines whether the extracted inverted data is in inverse relative to the extracted ECC and detects errors in the extracted ECC with reference to the determined result. In detail, the control unit 300 may invert the extracted inverted data, determines whether the inverted result matches the extracted ECC, and determines that the extracted ECC includes errors if the inverted result does not match the extracted ECC.

In the present exemplary embodiment, it is assumed that ECC can detect and correct one-bit errors and detect, but not correct two-bit errors and that it is yet to be known whether the ECC can be adapted to detect and correct errors of three or more bits. Thus, if errors of two or more bits are detected from the extracted ECC, the control unit 300 determines all of the data stored in the data region 610, the ECC region 620, and the inverted data region 630 as being invalid because there is a possibility of ECC improperly correcting errors of three or more bits. Therefore, in the present exemplary embodiment, it is possible to minimize the possibility of improper error correction by determining data stored in a flash memory as being invalid if errors of two or more bits are detected from the data.

In addition, if no erroneous bit or only one erroneous bit is detected from the ECC stored in the ECC region 620, error detection and correction, which involves generating ECC corresponding to the data stored in the data region 610; detecting an error from the ECC stored in the ECC region 620 by comparing the generated ECC with the ECC stored in the ECC region 620, and correcting the detected error, may be carried out.

A data processing method for a flash memory according to an exemplary embodiment of the present invention will now be described in detail.

Figure 7:
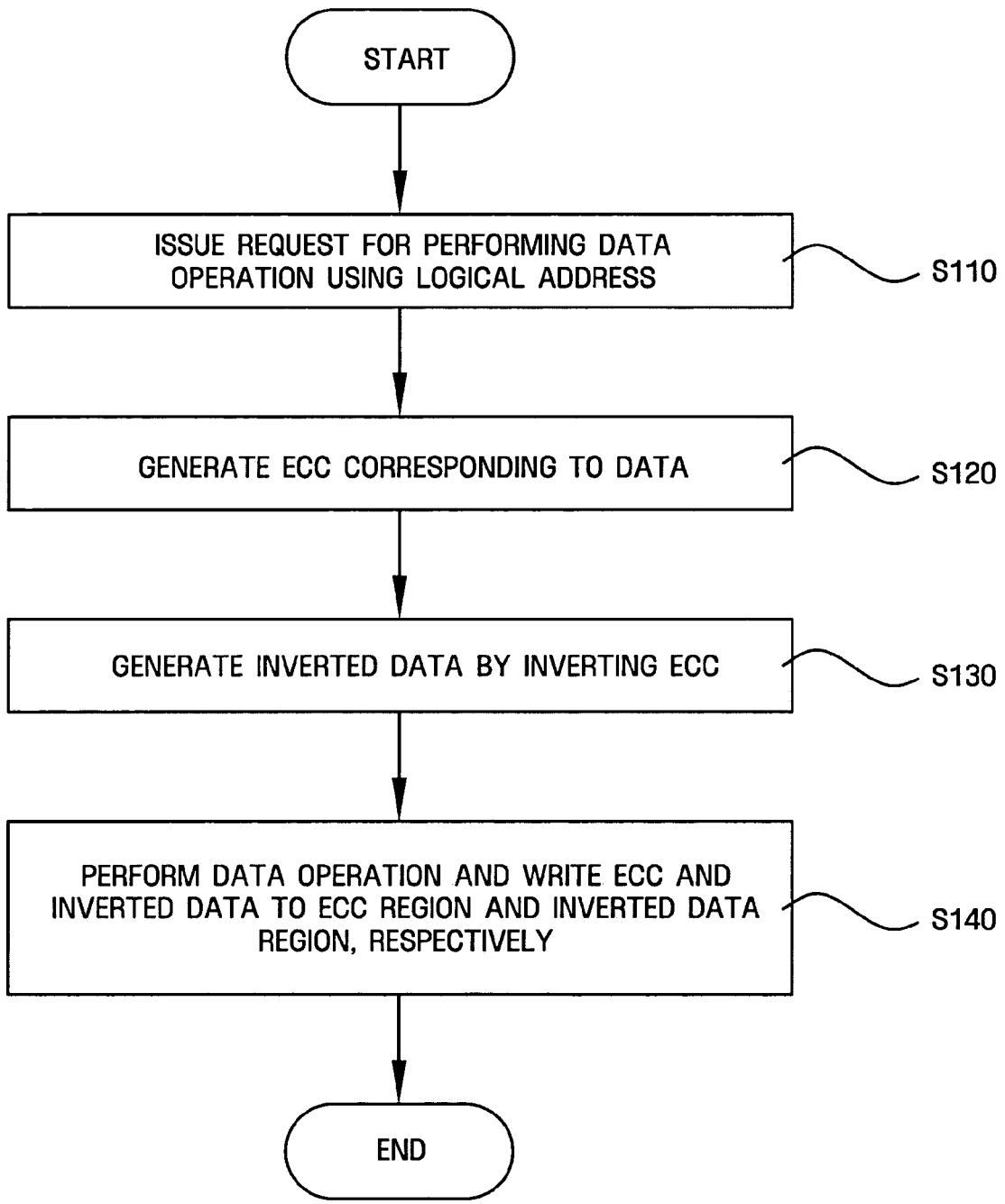
FIG. 7 is a flowchart illustrating a method of writing ECC and inverted data to a flash memory according to an exemplary embodiment of the present invention.

FIG. 7 is a flowchart illustrating a method of generating inverted data by inverting ECC during the performing of a data operation on a flash memory according to an exemplary embodiment of the present invention.

Referring to FIG. 7, in operation S110, a user issues a request for performing a data operation on a flash memory using a predetermined logical address to the user request unit 100.

In operation S120, the control unit 300 generates ECC corresponding to data to be used in the data operation before performing the data operation.

In operation S130, the control unit 300 generates inverted data by inverting the ECC using a predetermined conversion method.

In detail, the control unit 300 loads the data to be used in the data operation in a buffer, generates ECC based on the loaded data, and generates inverted data by inverting the ECC, and loads the inverted data in the buffer.

Figure 8:
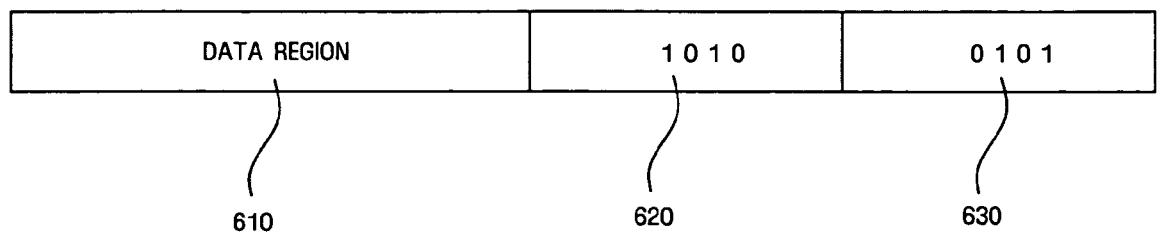
FIG. 8 is a diagram illustrating ECC and inverted data written to a flash memory according to an exemplary embodiment of the present invention.

For example, as illustrated in FIG. 8, if the ECC is "1010", inverted data obtained by inverting the ECC using a 1's complement number conversion method may be "0101".

Thereafter, in operation S140, the control unit 300 writes the generated ECC and the generated inverted data to an ECC region and an inverted data region, respectively, while performing the data operation. That is, the generated ECC and the generated inverted data are written from the buffer to their respective regions when the data to be used in the data operation is written from the buffer to a data region.

A method of determining whether ECC generated and then written to an ECC region using the method of FIG. 7 includes errors with reference to inverted data generated using the method of FIG. 7 according to an exemplary embodiment of the present invention will now be described with reference to FIG. 9.

Figure 9:
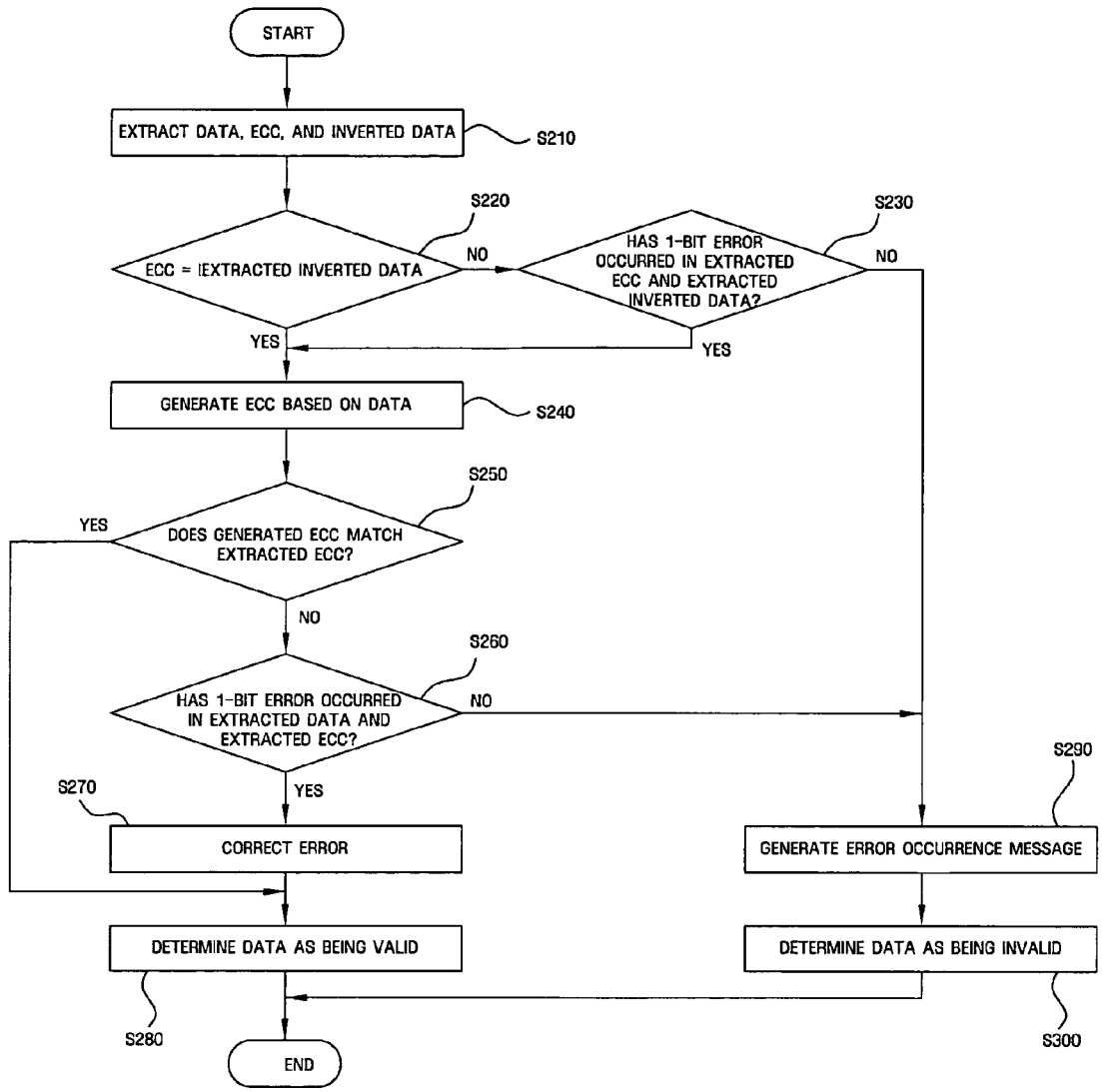
FIG. 9 is a flowchart illustrating a method of detecting and correcting errors using ECC and inverted data according to an exemplary embodiment of the present invention.

Referring to FIG. 9, in operation S210, the extraction unit 500 extracts data, ECC, and inverted data from a data region 610, an ECC region 620, and an inverted data region 630.

In operation S220, the control unit 300 inverts the extracted inverted data and determines whether the inverted result matches the extracted ECC. For example, if the extracted ECC does not have any error, the inverted result obtained in operation S220 may be the same as the extracted ECC, as illustrated in FIG. 8.

In operation S230, it is determined whether a one-bit error has occurred in the extracted ECC according to whether the inverted result is the same as the extracted ECC.

In operation S240, if the inverted result matches the extracted ECC or a one-bit error is detected from the extracted ECC, the control unit 300 generates ECC based on the extracted data. In detail, the control unit 300 generates ECC based on the same algorithm used to generate the extracted ECC.

Figure 10A:
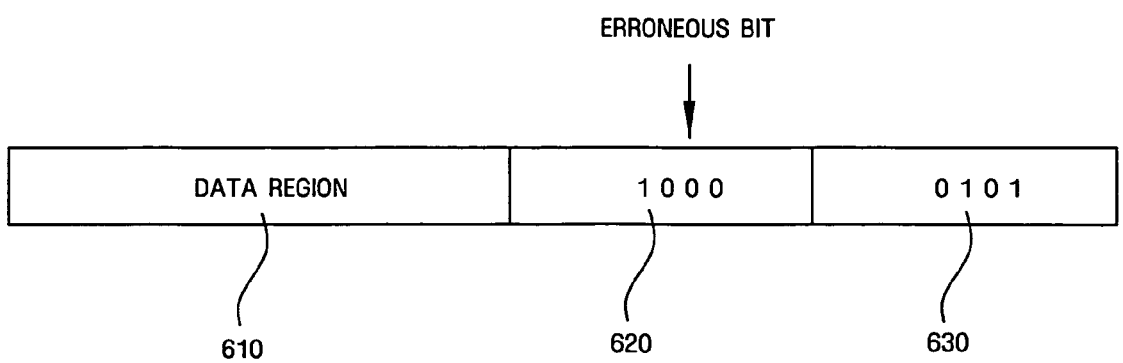
FIG. 10A is a diagram illustrating an ECC region of a flash memory where a one-bit error has occurred, according to an exemplary embodiment of the present invention.

In detail, as illustrated in FIG. 10A, if a one-bit error has occurred in the extracted ECC or in the inverted result obtained in operation S220, as illustrated in FIG. 10A, error detection may be carried out on the extracted data and the extracted ECC because one-bit errors are correctible.

If the generated ECC does not match the extracted ECC in operation S250, the control unit 300 determines whether a one-bit error have occurred in the extracted data and the extracted ECC in operation S260.

In operation S270, if a one-bit error is detected from the extracted data and the extracted ECC, the one-bit error is corrected. Thereafter, in operation S280, the extracted data is determined as being valid.

However, if a two-bit error is determined in operation S230 to have occurred in the extracted ECC and the inverted result obtained in operation S220 or if a two-bit error is determined in operation S260 to have occurred in the extracted data and in the extracted ECC, an error occurrence message is created in operation S290. Thereafter, in operation S300, the extracted data is determined as being invalid because, in the present exemplary embodiment, two-bit errors are detectible, but not correctible.

Figure 10B:
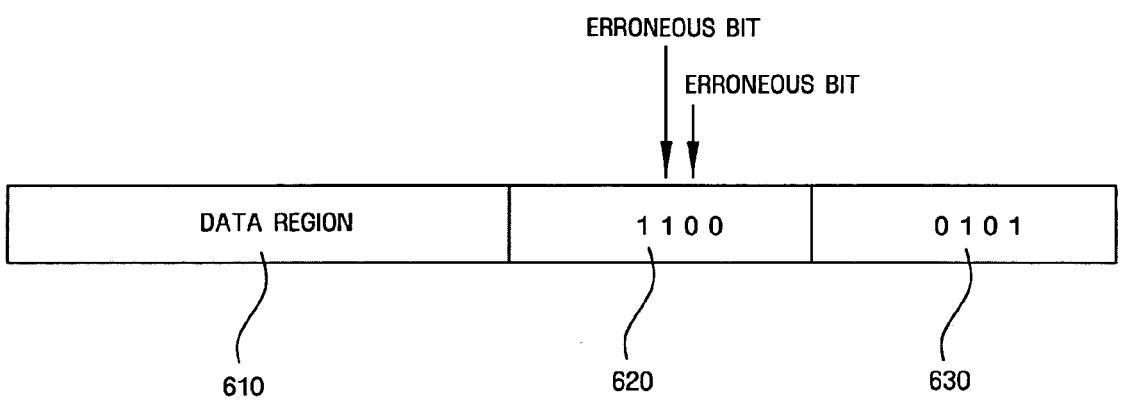
FIG. 10B is a diagram illustrating an ECC region of a flash memory where a two-bit error has occurred, according to an exemplary embodiment of the present invention.

If a two-bit error is determined to have occurred in the extracted ECC and the extracted inverted data, as illustrated in FIG. 10B, there is already a possibility of improper error correction regardless of whether the extracted data is erroneous. Therefore, in the present exemplary embodiment, if a two-bit error is determined to have occurred in the extracted ECC and the extracted inverted data, the extracted data and the extracted ECC are determined as being invalid.

In the present invention, it is determined whether extracted ECC is erroneous and then errors, if any, are detected from the extracted data and the extracted ECC. If a two-bit error is detected from the extracted ECC, the extracted data and the extracted ECC are determined as being invalid regardless of whether the extracted data is erroneous. Therefore, even if errors of 3 or more bits are determined to have occurred in a flash memory, the possibility of improper error correction based on ECC can be minimized because the flash memory is prevented from being error-corrected once errors of two bits are detected from the flash memory.

According to the present invention, it is possible to minimize the possibility of improper error correction based on ECC when errors of a predefined number of bits or more occur in a flash memory.

In concluding the detailed description, those skilled in the art will appreciate that many variations and modifications can be made to the exemplary embodiments without substantially departing from the principles of the present invention. Therefore, the disclosed exemplary embodiments of the invention are used in a generic and descriptive sense only and not for purposes of limitation.

What is claimed is:

1. A data processing apparatus for a flash memory comprising:
a user request unit which issues a request for performing a data operation on a flash memory using a logical address;
a conversion unit which converts the logical address into a physical address; and
a control unit which performs the data operation on the physical address and writes inverted data to an inverted data region of the flash memory, the inverted data used to indicate whether an extracted ECC is erroneous,
wherein, before performing the data operation, the control unit obtains the inverted data and loads the inverted data into a buffer by inverting generated error correction code (ECC) loaded in the buffer, the generated ECC corresponding to data loaded in the buffer which is to be used in the data operation, and
wherein, while performing the data operation, the control unit writes the inverted data from the buffer to the inverted data region of the flash memory, and writes the generated ECC from the buffer to an ECC region of the flash memory to be extracted from the ECC region as the extracted ECC, the inverted data and the extracted ECC being mutually exclusive of each other.

2. The data processing apparatus of claim 1, wherein the inverted data is inverse relative to the generated ECC, which is generated from the data loaded into the buffer to be used in the data operation, and the extracted ECC corresponds to the generated ECC, the extracted ECC being written to the ECC region of the flash memory.

3. A data processing apparatus for a flash memory comprising:

an extraction unit which extracts from memory regions of the flash memory error correction code (ECC) and inverted data, the inverted data being obtained before a data operation requested by a user is performed by inverting generated ECC loaded in a buffer, the generated ECC generated from data loaded into the buffer to be used in the data operation not yet performed, the extracted ECC and the extracted inverted data each corresponding to data located at a logical address; and a control unit which determines whether the extracted ECC is erroneous and a number of erroneous bits included in the extracted ECC with reference to a relationship between the extracted ECC and the extracted inverted data, wherein the extracted inverted data and the extracted ECC are mutually exclusive of each other.

4. The data processing apparatus of claim 3, wherein the extracted ECC corresponds to the generated ECC, the extracted ECC being written to an ECC region of the flash memory and the extracted inverted data being written to an inverted data region of the flash memory.

5. The data processing apparatus of claim 4, wherein the control unit determines that the extracted ECC is valid if the extracted ECC matches ECC obtained by inverting the extracted inverted data.

6. The data processing apparatus of claim 5, wherein, if the number of erroneous bits included in the extracted ECC is not smaller than a predefined number, the control unit determines that the data located at the logical address, the extracted ECC, and the extracted inverted data are invalid.

7. The data processing apparatus of claim 6, wherein, if the number of erroneous bits included in the extracted ECC is smaller than the predefined number, the control unit generates another ECC based on the data located at the logical address, compares the other generated ECC with the extracted ECC, and determines whether the data located at the logical address is erroneous based on a comparison result.

8. A data processing method for a flash memory comprising:

issuing a request for performing a data operation on a flash memory using a logical address;

converting the logical address into a physical address;

before performing the data operation, obtaining inverted data by inverting a generated error correction code (ECC) loaded in a buffer corresponding to data loaded in the buffer which is to be used in the data operation, and loading the inverted data into the buffer;

performing the data operation on the physical address, writing inverted data loaded in the buffer and obtained by inverting the generated error correction code (ECC) corresponding to data used in the data operation to an inverted data region of the flash memory, and writing the generated ECC from the buffer to an ECC region of the flash memory to be extracted from the ECC region as an extracted ECC, the inverted data used to indicate whether an-the extracted ECC stored in the ECC region of the flash memory is erroneous, wherein the inverted data and the extracted ECC are mutually exclusive of each other.

9. The data processing method of claim 8, wherein the inverted data is inverse relative to the generated ECC, which is generated from the data loaded into the buffer to be used in the data operation, and the extracted ECC corresponds to the generated ECC, the extracted ECC being written to the ECC region of the flash memory.

10. A data processing method for a flash memory comprising:

extracting error correction code (ECC) and inverted data, the inverted data being obtained by inverting generated ECC loaded in a buffer and generated from data loaded into the buffer to be used in the data operation not yet performed, the extracted ECC and the extracted inverted data each corresponding to data located at a logical address; and determining whether the extracted ECC is erroneous and a number of erroneous bits included in the extracted ECC with reference to a relationship between the extracted ECC and the extracted inverted data, wherein the extracted inverted data and the extracted ECC are mutually exclusive of each other.

11. The data processing method of claim 10, wherein the extracted ECC corresponds to the generated ECC, the extracted ECC being written to an ECC region of the flash memory and the extracted inverted data being written to an inverted data region of the flash memory.

12. The data processing method of claim 11, wherein the determining of whether the extracted ECC is erroneous comprises:

inverting the extracted inverted data; and determining that the extracted ECC is valid if the inverted result matches the extracted ECC.

13. The data processing method of claim 12, wherein the determining of whether the extracted ECC is erroneous comprises determining that the data located at the logical address, the extracted ECC, and the extracted inverted data are invalid if the number of erroneous bits included in the extracted ECC is not smaller than a predefined number.

14. The data processing method of claim 13, wherein the determining of whether the extracted ECC is erroneous comprises:

if the number of erroneous bits included in the extracted ECC is smaller than the predefined number, generating another ECC based on the data located at the logical address;

comparing the generated other ECC with the extracted ECC; and determining whether the data located at the logical address is erroneous based on a result of the comparing.

15. A data processing apparatus of a flash memory comprising:

a user request unit which issues a request for performing a data operation on a flash memory using a logical address;

a conversion unit which converts the logical address into a physical address;

a control unit which, before performing the data operation, generates error correction code (ECC) corresponding to data loaded in a buffer to be used in the data operation not yet performed and loads the generated ECC into the buffer, generates inverted data by inverting the generated ECC loaded into the buffer, performs the data operation on the physical address using the data, and writes the inverted data and the generated ECC to the flash memory while performing the data operation; and an extraction unit which extracts the ECC and the inverted data written to the flash memory;

wherein the control unit determines whether the extracted FCC is erroneous and a number of erroneous bits included in the extracted ECC with reference to a relationship between the extracted ECC and the extracted inverted data, and the extracted inverted data and the extracted ECC are mutually exclusive of each other.

16. The data processing apparatus of claim 15, wherein the extracted ECC corresponds to the generated ECC, the extracted ECC being written to an ECC region of the flash memory and the extracted inverted data being written to an inverted data region of the flash memory.

17. The data processing apparatus of claim 16, wherein the control unit determines that the extracted ECC is valid if the extracted ECC matches ECC obtained by inverting the extracted inverted data.

18. The data processing apparatus of claim 17, wherein, if the number of erroneous bits included in the extracted ECC is not smaller than a predefined number, the control unit determines that the data located at the logical address, the extracted ECC, and the extracted inverted data are invalid.

19. The data processing apparatus of claim 18, wherein, if the number of erroneous bits included in the extracted ECC is smaller than the predefined number, the control unit generates another ECC based on the data located at the logical address, compares the other generated ECC with the extracted ECC, and determines whether the data located at the logical address is erroneous based on a comparison result.

20. The data processing apparatus of claim 7, wherein the predefined number is two.

* * * * *